United States Patent [19]

Kamakura et al.

[11] Patent Number: 5,537,737
[45] Date of Patent: Jul. 23, 1996

[54] METHOD FOR MANUFACTURING AN OPTICAL MODULE

[75] Inventors: Mitsutoshi Kamakura; Akihiko Shioda; Yoshihide Enami; Hisao Go, all of Kanagawa, Japan

[73] Assignee: Sumitomo Electric Industries, Ltd., Osaka, Japan

[21] Appl. No.: 224,539

[22] Filed: Apr. 7, 1994

Related U.S. Application Data

[62] Division of Ser. No. 959,127, Oct. 9, 1992, Pat. No. 5,341,563.

[30] Foreign Application Priority Data

Jan. 22, 1992 [JP] Japan .................. 4-9498
Jan. 22, 1992 [JP] Japan .................. 4-9500
Jan. 22, 1992 [JP] Japan .................. 4-9501

[51] Int. Cl.⁶ .............. H05K 7/14; H05K 13/04; H01L 23/495; H01L 21/60
[52] U.S. Cl. .............. 29/827; 29/743; 29/DIG. 44; 437/220; 437/906
[58] Field of Search .............. 29/740, 743, 759, 29/760, 827, 840, 834, 876, DIG. 44; 361/813; 385/14, 15; 414/737; 437/220, 906; 228/6.1, 6.2, 212, 213, 904; 257/82, 674

[56] References Cited

U.S. PATENT DOCUMENTS

| | | | |
|---|---|---|---|
| 4,040,078 | 8/1977 | Eckton et al. | 257/82 X |
| 4,457,662 | 7/1984 | Ireland et al. | 29/743 X |
| 4,526,646 | 7/1985 | Suzuki et al. | 29/740 X |
| 4,631,815 | 12/1986 | Bocchicchio et al. | 29/743 X |
| 4,858,308 | 8/1989 | Komori | 29/743 X |
| 4,953,287 | 9/1990 | West et al. | 29/743 X |
| 5,049,527 | 9/1991 | Merrick et al. | 437/906 X |
| 5,056,296 | 10/1991 | Ross et al. | 29/841 X |
| 5,123,066 | 6/1992 | Acarlar | 385/14 |
| 5,267,379 | 12/1993 | Pak | 29/827 X |
| 5,365,655 | 11/1994 | Rose | 29/827 |

FOREIGN PATENT DOCUMENTS 0289102  11/1988  European Pat. Off. .

*Primary Examiner*—Peter Vo
*Attorney, Agent, or Firm*—Cushman Darby & Cushman

[57] ABSTRACT

The optical module manufacturing apparatus according to the present invention includes a pallet 205 on which the optically operating members and the lead frame are set to be kept in a positional relationship; a wire connection means 202 and 213 for connecting the wires to the members, the frame and the electronic circuits on the frame as the members and the frame remain kept in the positional relationship; conveyors 207, 208 and 209 for conveying the members and the frame to dies 204 after the connection as the members and the frame remain kept in the relationship; and a die-setting means 203 for setting the members and the frame in the dies through the suction of the members and the frame away from the pallet onto the setting means after the conveyance as the members and the frame remain kept in the relationship.

12 Claims, 11 Drawing Sheets

SUCKING PORTION

PALLET POSITIONING PORTION

DIE

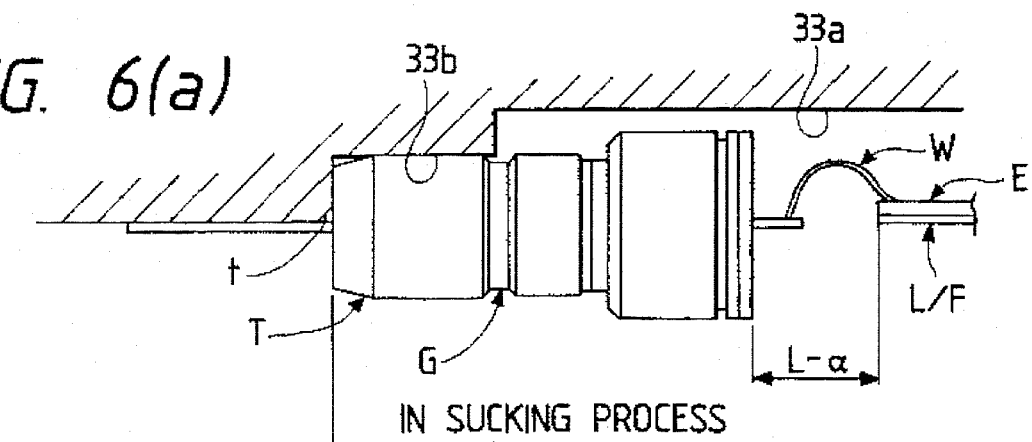
FIG. 6(a) IN SUCKING PROCESS
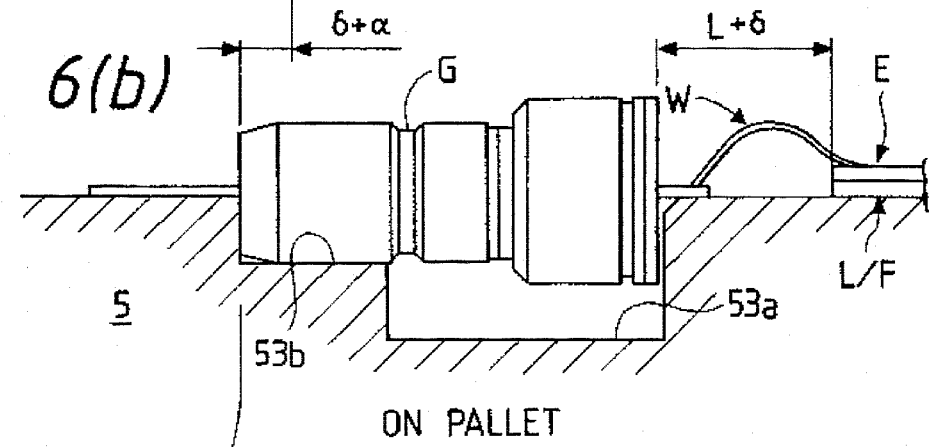
FIG. 6(b) ON PALLET
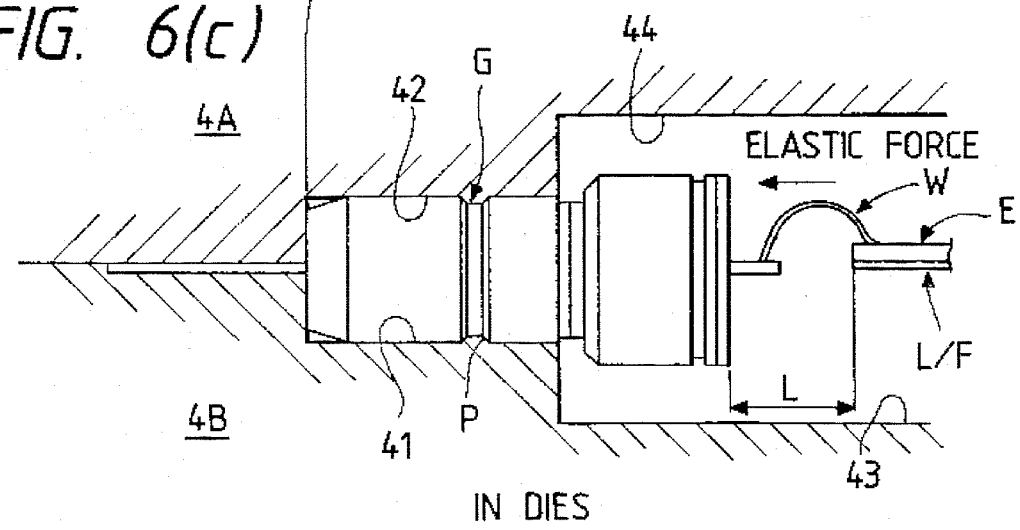
FIG. 6(c) IN DIES

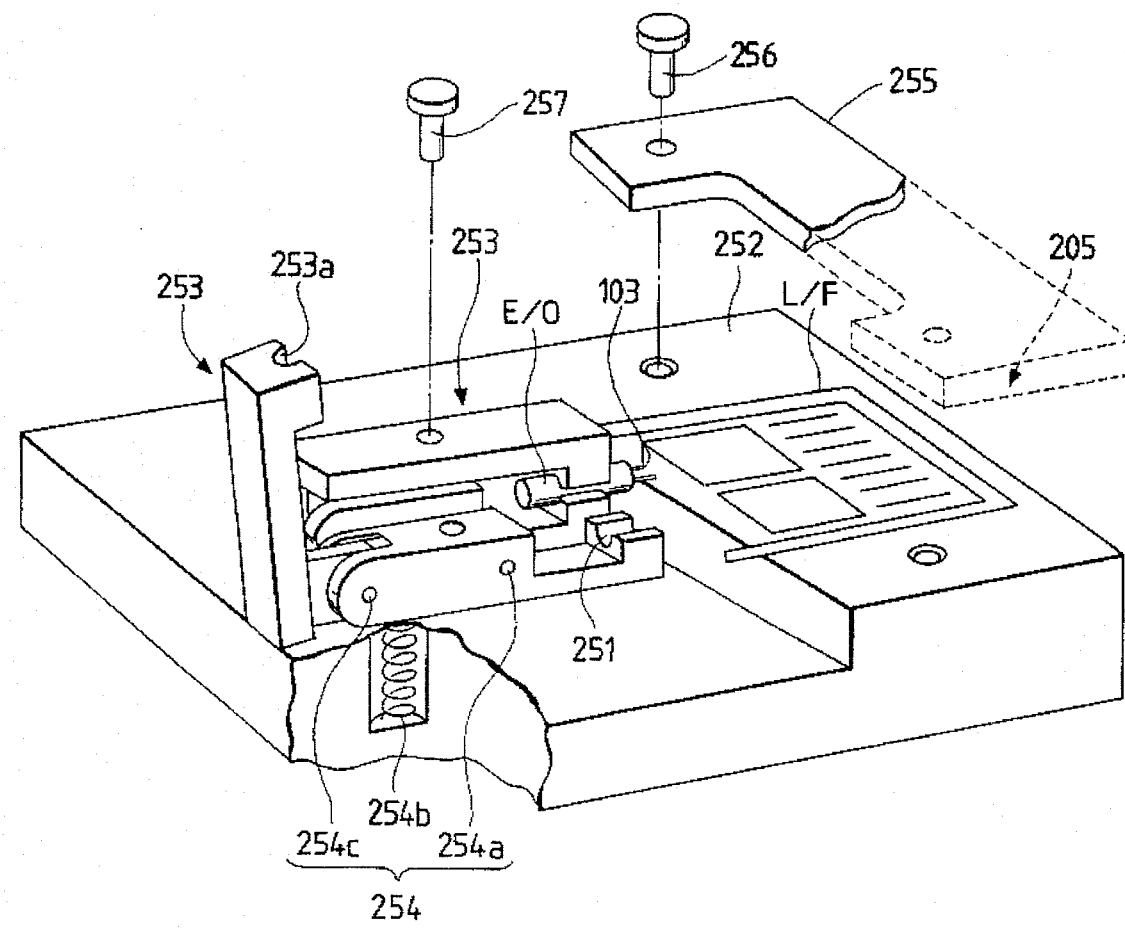

METHOD FOR MANUFACTURING AN OPTICAL MODULE

This is a division of application Ser. No. 07/959,127, filed Oct. 9, 1992 now U.S. Pat. No. 5,341,563.

BACKGROUND OF THE INVENTION

The present invention relates to an apparatus and a method in which an optical module including a lead frame and optically operating members such as a light emitter and a light receiver is manufactured through the use of dies. In addition, the present invention also relates to a clamper for clamping optically-operating members such as a light emitter and a light receiver and a lead frame for an optical module when connecting wires to the members and the frame.

A conventional method of manufacturing an optical module, in which optically operating members which are a light emitter E/O and a light receiver O/E, for example, and connected to electronic circuits with wires W, as shown in FIG. 7, and a lead frame L/F are set in dies and then integrally molded with a resin, has been proposed. The method includes a wire bonding step in which the optically operating members and the electronic circuits formed on the lead frame are connected with the wires w of aluminum by a wire bonder, and a molding step in which a workpiece having the members, the circuits, the wires connected to them, and the lead frame is set in the dies and then integrally molded with the resin.

Since the lead frame L/F coupled to the light emitter E/O and the light receiver O/E with the wires W is picked up and carried with tweezers during the manufacturing of the optical module in the conventional method, as shown in FIG. 7, the weight of the light emitter and that of the light receiver act on the wires so that it is likely that excessive stress is caused in the wires and the optically operating members are put out of a prescribed positional relationship to break or cut off the wire to lower the reliability or yield of the optical module.

In addition, in a conventional apparatus for manufacturing the optical module, a means for conveying the workpiece to the wire bonding section, and a means for conveying the workpiece to the dies of the molding section are provided separately from each other. For that reason, a workman needs to manually transfer the workpiece from a workpiece clamper for the wire bonding section to a conveyance pallet after the connection of the wires to the members and the frame and then transfer the workpiece from the pallet to the dies of the molding section. Since the members and the frame coupled thereto with the wires are not accurately fixed in a positional relationship, the aluminum wires are stressed during the transfer to make it likely that the strength of the wires falls to make them defective after the transfer. For that reason, the workpiece needs to be removed and set before and after the conveyance as the members and the frame remain accurately kept in the positional relationship. If the dies are very high in accuracy, it is difficult to set the members and the frame in the positional relationship in the dies as accurately as them. For that reason, it is necessary to realize a degree of freedom for coping with the inaccurate setting of the members and the frame in the dies. Since the transfer is performed through batch processing, the transfer is not appropriate for a single-unit-flow production line, and makes it necessary to prepare a large number of pallets for temporary-storage.

Further, an optical module manufacturing art, in which optically operating members which are a light emitter and a light receiver, for example, and a lead frame coupled to the members with wires are set in dies and then integrally molded with a resin to constitute an optical module, has been proposed. FIG. 13 is a perspective view of a workpiece having the light emitter E/O, the light receiver O/E and the lead frame L/F coupled to them with the wires W. The lead frame L/F includes a peripheral portion, islands, and inner and outer lead pins. Electronic circuit elements mounted on the islands constitute electronic circuits which are a light emission circuit and a light reception circuit. The optically operating members E/O and O/E, and the inner lead pins are connected to the electronic circuits C with the wires W. The optical module is manufactured by taking a wiring step in which the electronic circuits C are connected to the optically operating members E/O and O/E and the inner pins by the wires W of aluminum, a die-setting step in which the workpiece having these module components connected with the wires is set in the dies, and a molding step in which the resin is injected into the dies so that the components are integrally molded with the resin.

A conventional clamper for the wiring step includes a block 101, and a cover 102, as shown in FIG. 14. The block 101 has V-shaped-cross-section grooves 101a, in which the optically operating-members E/O and O/E are positioned, and a clamping surface 101b, to which the lead pins of the members and the lead frame L/F are clamped on the same plane. The cover 102 has V-shaped-cross-section grooves 102a whose positions correspond to those of the grooves 101a of the block 101 and which are for holding the members E/O and O/E, and an opening 102b at which the wire-connected portions of the inner lead pins and islands of the lead frame L/F and the lead pin ends of the members are exposed. The lead frame is pinched between the block 101 and the cover 102 so that the frame is clamped. The portions of the inner lead pins of the lead frame clamped on the clamping surface 101b of the block 101 and the ends of the lead pins 103 of the members E/O and O/E clamped on the surface are connected to the wires W by an ultrasonic wire bonder, as shown in the part (a) of FIG. 15. The bonder destroys the oxide films of the surfaces of the connected parts of these components by ultrasonic vibration energy to connect them to each other.

Since the positioning grooves 101a of the conventional clamper and the clamping plane surface 101b thereof are in a fixed positional relationship, the optically operating members E/O and O/E and the lead frame L/F cannot properly be clamped by the clamper for the connection of the wires W if the end of the lead pin 103 of the member is fused and coupled in a wrong position to the body of the member due to the failure in the optical centering of the member during the assembly thereof, as shown in the other parts (b) and (c) of FIG. 15. If the end of the lead pin 103 is fused and coupled in an upper wrong position as shown in the part (b) of FIG. 15, a gap is made between the pin and the clamping surface 101b so that the wire W cannot be connected to the end of the pin by the wire bonder. If the end of the lead pin 103 is fused and coupled in a lower wrong position as shown in the part (c) of FIG. 15, the pin is bent at the time of the pushing-down of the member with the cover 102 so that the pin-secured portion of the member is damaged or the wire W cannot be connected to the pin.

Besides, when the workpiece having the optically operating members, the lead frame and the wires connected to them is taken out from the clamper, the wire is likely to be stressed to be damaged.

Since the wire bonder is kept from coming into contact with the cover 102 when the bonder is put in contact with the wire-connected portion of the lead frame L/F, the frame cannot be clamped near the portion by the cover. For that reason, the inner lead pin of the frame is not clamped strongly enough, at the time of the connection of the wire W to the pin, to effectively transmit ultrasonic waves from the wire bonder to the wire-connected portion. This results in lowering the yield of the connection of the wire.

SUMMARY OF THE INVENTION

The present invention was made in order to solve the above-described problem of the conventional method. Accordingly, it is an object of the invention to provide a method of manufacturing an optical module, in which the components of the module are kept in a positional relationship to prevent in breaking and cutoff of wires to enhance the reliability and yield of the module.

The method according to the present invention includes a first step in which optically operating members and a lead frame are set on a pallet so as to be kept in the positional relationship; a second step in which the pallet is conveyed to a wire connecting section, and electronic circuits formed on the frame are then connected to the members and the frame with the wires as the members and the frame remain kept in the positional relationship on the pallet; and a third step in which the pallet is conveyed to a die-setting section, and the members and the frame are then sucked away from the pallet onto a suction head and set in dies as the members and the frame remain kept in the positional relationship.

In all the steps of the optical module manufacturing method provided in accordance with the present invention, the pallet is conveyed except in the first step as the optically operating members and the lead frame remain kept in the positional relationship on the pallet. During the period of the conveyance, connecting the wires to the electronic circuits, the members and the frame, and setting them in the dies are automatically performed.

In addition, the present invention was made in order to solve the above-described problems of the conventional apparatus. Accordingly, it is an object of the invention to provide an optical module manufacturing apparatus which prevents the fall in the strength of wires after the electric connection thereof to optically operating members, a lead frame and electronic circuits to lower the possibility of breaking or cutoff of the wires after the molding of the members, the frame, the circuits and the wires in dies, and is capable of the unmanned transfer and conveyance of the members and the frame, and single-unit-flow production.

The apparatus includes a pallet on which the optically operating members-and the lead frame are set to be kept in a positional relationship; a wire connection means by which the electronic circuits formed on the frame are connected to the members and the frame with the wires as the members and the frame remain kept in the relationship; a conveyance means for conveying the members and the frame to the dies after the connection as the members and the frame remain kept in the relationship; and a die-setting means for setting the members and the frame in the dies through the suction of the members and the frame away from the pallet after the conveyance as the members and the frame remain kept in the relationship.

In the optical module manufacturing apparatus provided in accordance with the present invention, the optically operating members and the lead frame are conveyed to the wire connection means and the dies as the members and the frame remain kept in the positional relationship. During the period of the conveyance, connecting the electronic circuits to the members and the frame with the wires, and setting them in the dies are automatically performed.

Further, the present invention was made in order to solve the above-described problems of the conventional clamper. Accordingly, it is an object of the invention to provide a clamper to put wire-connected portions in tight contact with a clamping surface to prevent the fall in the strength of wires and enhance the yield of the manufacturing of an optical module.

An example of the clamper according to the present invention includes the clamping surface on which a lead frame is clamped; a clamping member for clamping the frame on the surface; positioning grooves in which optically operating members are positioned relative to the surface; holding members for holding the operating members in the grooves; and swing mechanisms for swinging the holding members and the grooves together to push the ends of the lead pins of the operating members onto the surface.

Another example of the clamper according to the present invention includes a pallet having a clamping surface on which a lead frame is clamped, positioning grooves in which optically operating members are positioned relative to the clamping surface, and a processing portion which protects up from the surface and on which the inner lead pins and islands of the frame and the ends of the lead pins of the operating members are put; a clamping member for clamping the frame on the surface; and holding members for holding the operating members positioned in the grooves.

As for the former example of the clamper, the ends of the lead pins of the optically operating members are pushed onto the clamping surface by the swing mechanisms so that the ends are put in tight contact with the surface.

As for the latter example of the clamper, the wire-connected portions which are the inner lead pins and islands of the lead frame and the ends of the lead pins of the optically operating members are put on the processing portion projecting up from the clamping surface. For that reason, the wire-connected portions are put in tight contact with the processing surface of the processing portion. Especially, the inner pins of the lead frame are clamped nearer the wire-connected parts of the pins.

BRIEF DESCRIPTION OF THE DRAWINGS

FIGS. 6(A)–(C) are sectional views of the sucking section, the pallet and the upper and lower dies of the apparatus in the direction Z to illustrate the positioning of the members and the frame on the sucking section and the pallet and in the dies;

FIG. 8 is a perspective view of a clamper which is an embodiment of the present invention;

DETAILED DESCRIPTION OF THE PREFERRED EMBODIMENTS

Embodiments of the present invention are hereafter described with reference to the drawings attached hereto. Hereinafter, mutually equivalent parts are denoted by identical reference symbols, and not repeatedly described.

Figure 1:
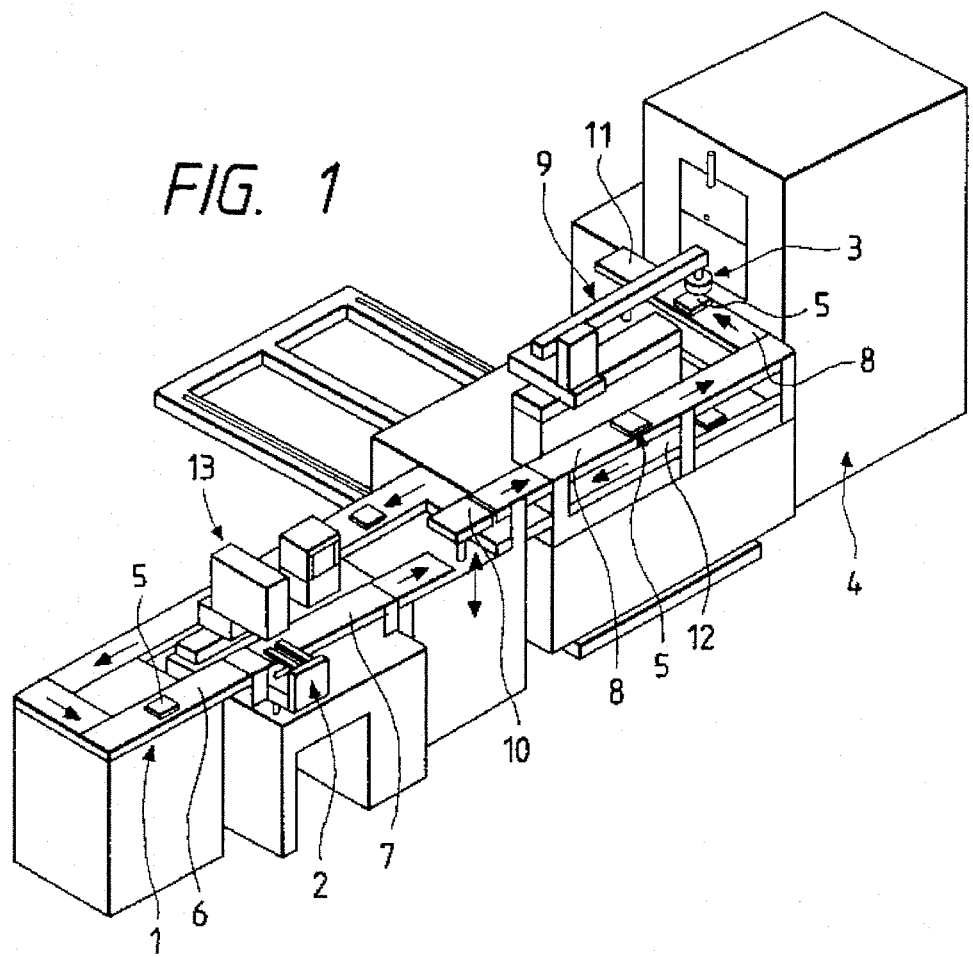
FIG. 1 is a perspective view of an optical module manufacturing apparatus for practicing an optical module manufacturing method which is an embodiment of the present invention.
Figure 2:
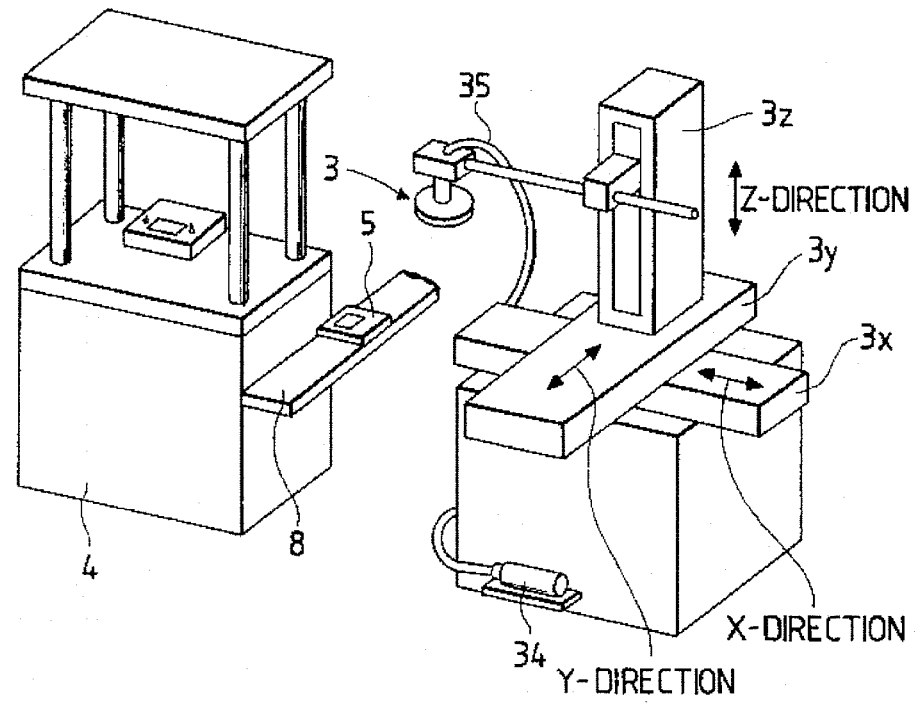
FIG. 2 is a perspective view of the sucking and molding sections of the apparatus.
Figure 3A:
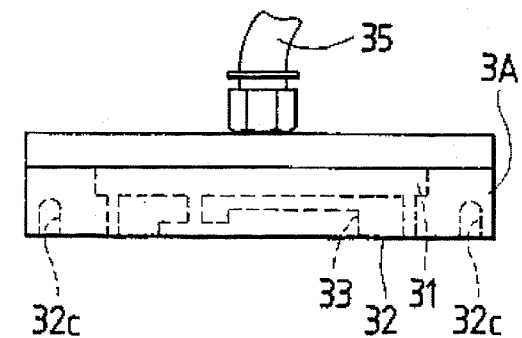
FIGS. 3(A)–(C) are views of the sucking section to illustrate the constitution thereof.
Figure 3B:
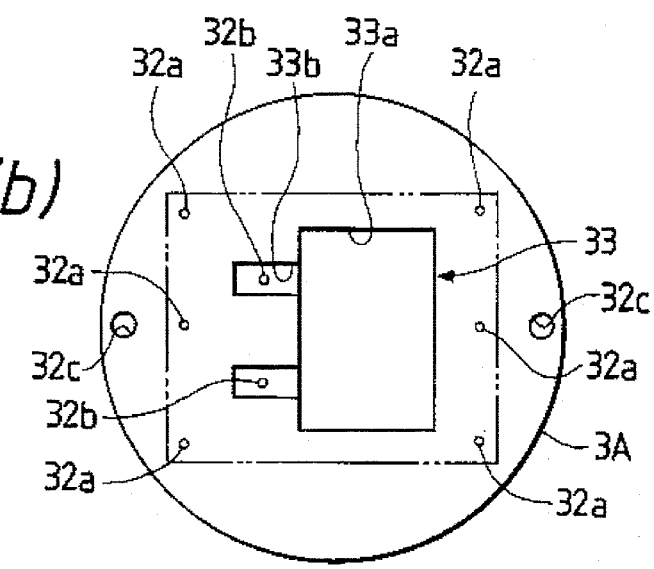
Figure 3C:
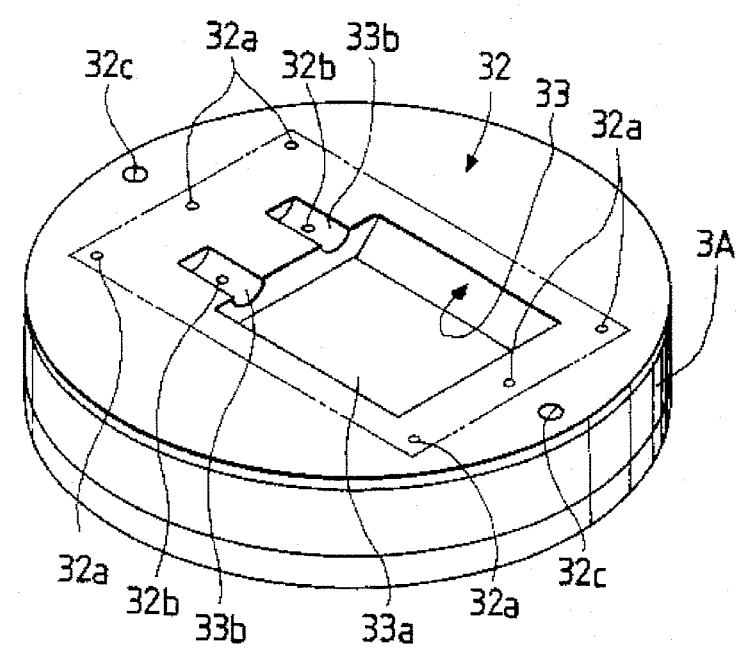

FIGS. 1, 2 and 3 show an optical module manufacturing apparatus for practicing an optical module manufacturing method which is the embodiment. FIG. 1 is a perspective view of the apparatus. FIG. 2 is a perspective view of the sucking section 3 and molding section 4 of the apparatus. FIG. 3 shows the constitution of the sucking section 3. The apparatus includes a setting section 1, a workpiece automatic clamping section 2, a wire bonding section 13 which is a wire connection means, the sucking section 3 which is a die-setting means, the molding section 4, and conveyors 6, 7, 8 and 9 for conveying a pallet 5 to these sections.

After the pallet 5 is conveyed to the setting section 1 by the conveyor 6, the pallet 5 is secured in a prescribed position, and optical module components which are optically operating members and a lead frame are positioned on the pallet. The components are thereafter automatically conveyed to the workpiece automatic clamping section 2, the sucking section 3 and the molding section 4 through the use of the pallet 5 as the components remain kept in a positional relationship. For that purpose, the pallet 5 has a rectangular recess 53a, in which portions of the lead pins of the optically operating members are put, V-shaped-cross-section recesses 53b, in which the front end porions of the members are put, and a carrying surface 53c, on which the lead frame and electronic circuits formed on the frame are put, as shown in the part (b) of FIG. 4. When the components are positioned on the pallet 5 at the setting section 1, a light emission element and a light reception element are already included in the optically operating members, and a plurality of electronic circuit element constituting the electronic circuits which are a sending and a reception circuits to be connected to the members are already mounted on the islands of the lead fame. The members, the electronic circuits and the lead frame are not yet connected to each other at the setting section 1.

After the optically operating members and the lead frame are positioned on the pallet 5 at the setting section 1, pallet is conveyed together with the members and the frame to the workpiece automatic clamping section 2 by the conveyor 6. At the clamping section 2, wires are connected to the members and the frame as the members and the frame remain in the positional relationship on the pallet 5. At that time, the wires are bonded to the frame, the members and the electronic circuits by the wire bonding section 13 so that some of the wires are connected to the lead pins of the frame and the circuits formed on the islands of the frame, and the others of the wires are connected to the members and the circuits.

After the wire bonding at the workpiece automatic clamping section 2, the pallet 5 is conveyed together with the lead frame and the optically operating members to the sucking section by the conveyors 7 and 8. Since conveyor 8 is located above the other 7, the pallet 5 conveyed by the latter is moved up to the height of the former by a lifter 10 before the pallet is conveyed to the sucking section 3 by the former. The frame and the members are thereafter set in the molding section 4 by the sucking section 3. After the setting, the pallet 5 is put down onto a retrieving conveyor 12 by a lifter 11, and then conveyed back to the setting section 1 by the conveyor.

Figure 4A:
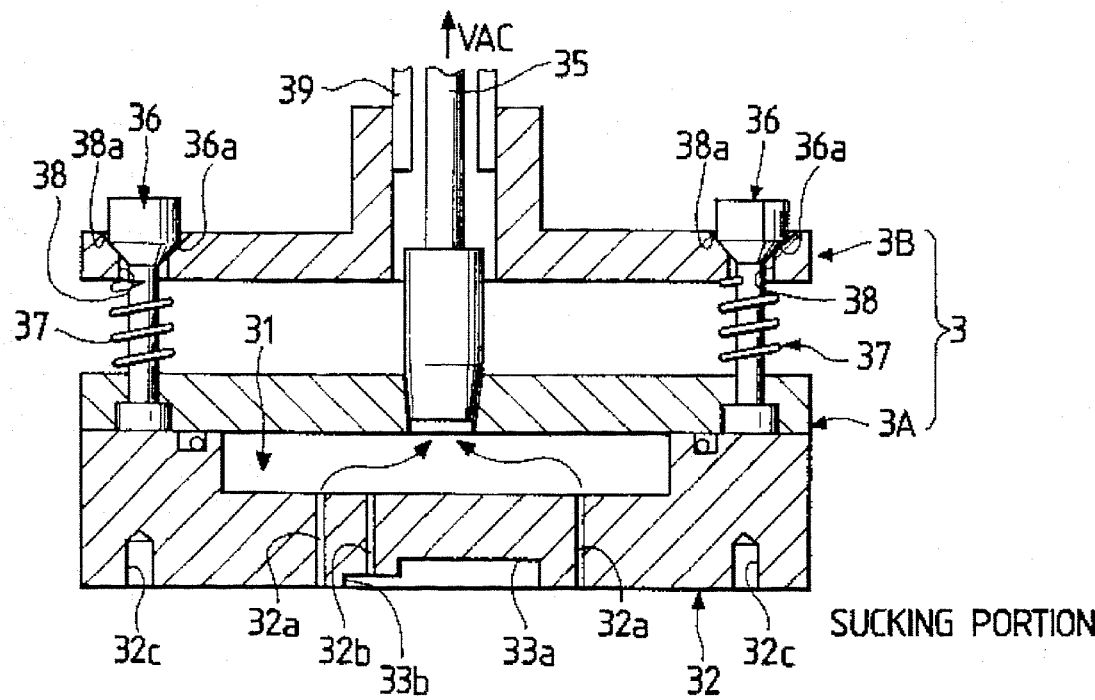
FIGS. 4(A)–(C) are sectional views of the sucking section, pallet and lower die of the apparatus in a direction Z to illustrate mechanisms for positioning the sucking section and the pallet for optically operating members and a lead frame.
Figure 4B:
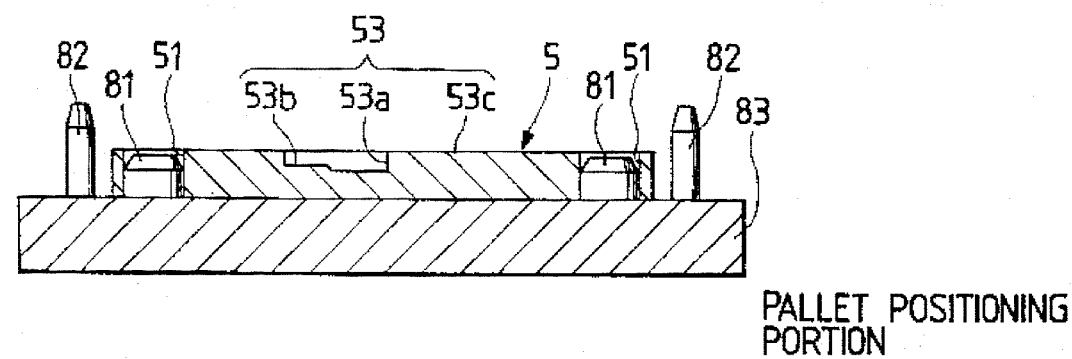
Figure 4C:
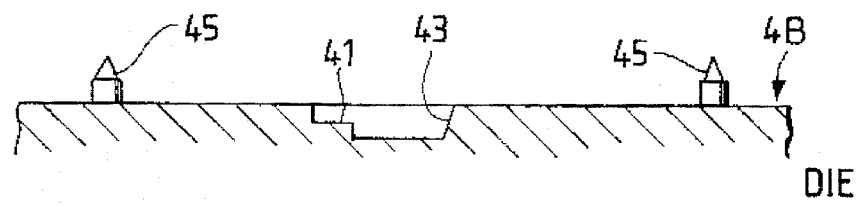

The sucking section 3 includes a suction head 3A, and a support plate 3B for supporting the head, as shown in the part (a) of FIG. 4. The lead frame and the optically operating members are sucked up from the pallet 5 onto the suction lead 3A as the frame and the members remain kept in the positional relationship. The suction head 3A and the support plate 3B are coupled to a moving unit $3z$ by the suction conveyor 9, as shown in FIGS. 1 and 2. The moving unit $3z$ has a mechanism for moving the sucking section 3 in a direction Z, and is disposed on another moving unit $3y$ having a mechanism for moving the section in another direction Y perpendicular to the former direction. The moving unit $3y$ is disposed on yet another moving unit $3x$ having a mechanism for moving the sucking section 3 in yet another direction X perpendicular to both the former directions X and Y. As a result, the sucking section 3 can be moved in all these directions.

The suction head 3A has a vacuum suction chamber 31, and a suction bottom surface 32 on which the peripheral portion of the lead frame is sucked, as shown in the parts (b) and (c) of FIG. 3. A positioning recess 33, in which the lead frame and the optically operating members connected with the wires are positioned as the frame and the members are sucked on the head 3A, is provided in the suction bottom surface 32. A plurality of suction holes 32a and 32b are opened in the surface 32, and communicate with the vacuum suction chamber 31. The positioning recess 33 includes a rectangular portion 33a, in which the electronic circuit elements mounted on the islands of the lead frame are put, and semicircular-cross-section portions 33b, in which the optically operating members are positioned. The position, size and form of the suction bottom surface 32 for sucking the elements, the members and the peripheral portion of the frame are determined depending on those of the rectangular recess 53a, V-shaped-cross-section recesses 53b and carrying surface 53c of the pallet 5, so that the frame and the members be sucked on the suction bottom surface without altering the positional relationship among the frame and the members.

The support plate 3B extends generally in parallel with the suction bottom surface 32 of the head 3A. A vacuum suction pipe 35 connected to a vacuum pump 34 shown in FIG. 3 extends through a guide pipe 39 fitted in the support plate 3B, and is connected to the suction head 3A to suck air out of the vacuum suction chamber 31 thereof so that the peripheral portion of the lead frame carrying the electronic circuit elements and located in contact with the suction surface 32, and the optically operating members located in the semicircular-cross-section portions 33b of the positioning recess 33 are sucked on the head because of the communication of the chamber with the suction holes 32a and 32b of the head.

Figure 5:
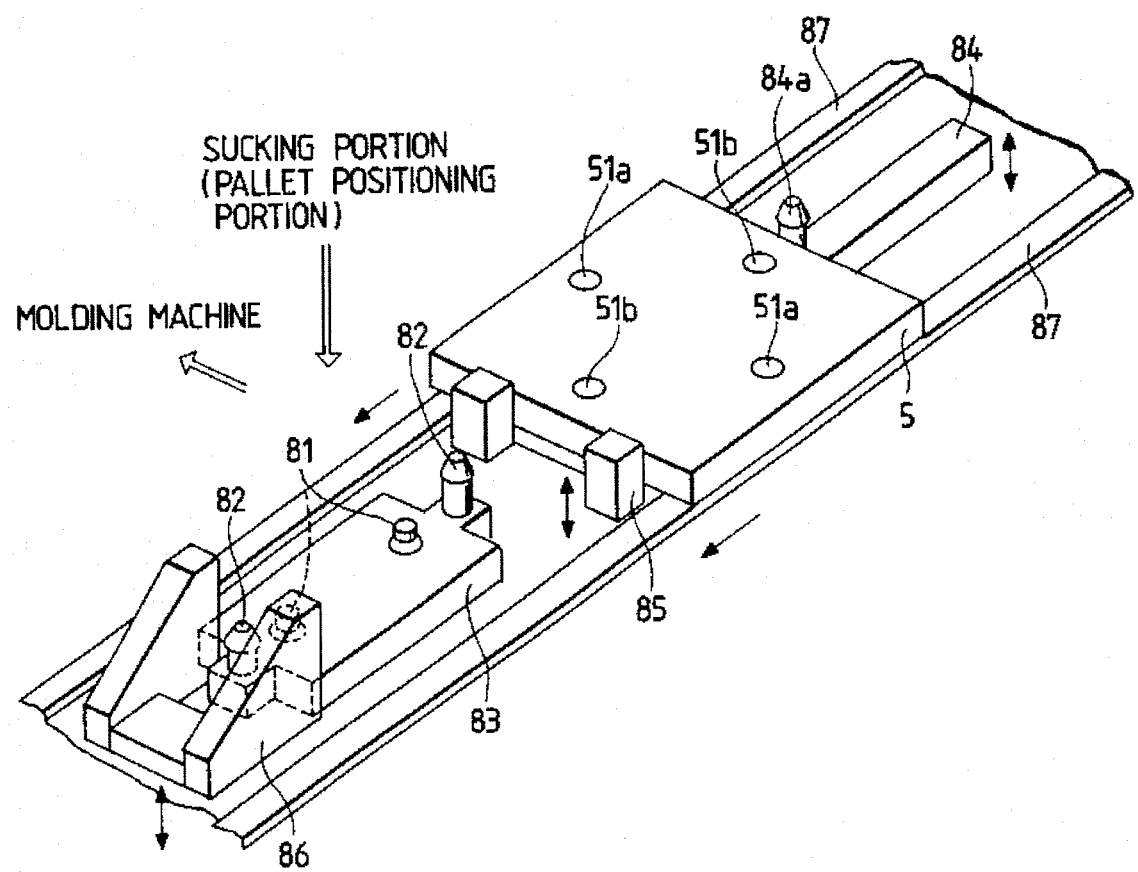
FIG. 5 is a perspective view of the pallet positioning mechanism of the conveyor 8 of the apparatus for the sucking section.
Figure 7:
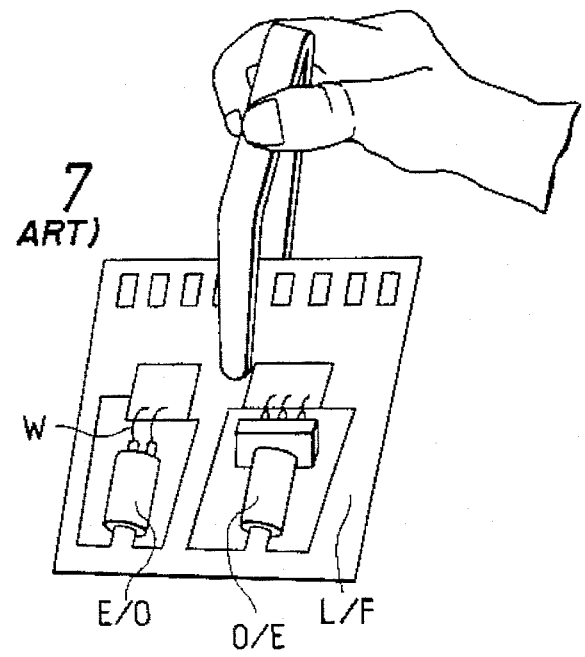
FIG. 7 is a perspective view to illustrate the state that optically operating members connected with wires, and a lead frame are conveyed in a conventional method of manufacturing an optical module.

Mechanisms for positioning the sucking section 3 and the pallet 5, and a mechanism for positioning the optically operating members in a lower die 4B are described with reference to FIGS. 4, 5 and 6 from now on. The part (a) of FIG. 4 is a sectional view in the direction Z to illustrate the mechanism for positioning the suction head 3A. The other part (b) of FIG. 4 is a sectional view in the direction Z to illustrate the mechanism for positioning the pallet 5. The yet other part (c) of FIG. 4 is a sectional view in the direction Z to illustrate the mechanism for positioning the optically operating members in the lower die 4B. FIG. 5 is perspective view to illustrate the mechanism for positioning the pallet 5 on the conveyor 8. The part (a) of FIG. 6 is a sectional view in the direction Z to illustrate the state that the members are positioned by the sucking section 3. The other part (b) of FIG. 6 is a sectional view in the direction Z to illustrate the state that the members are positioned by the pallet 5. The yet other part (c) of FIG. 6 is a sectional view in the direction Z to illustrate the state that the members are set in between an upper die 4A and the lower die 4B.

The mechanism for positioning the pallet 5 on the conveyor 8 is first described with reference to FIG. 5. Stoppers 84, 85 and 86, which stop the pallet 5 in position and can be vertically moved to be located below the tops of the conveyance belts 87 of the conveyor 8, and a positioning plate 83 are provided on the positioning portion of the conveyor. At first, the stopper 84 is located below the tops of the conveyance belts 87, and the other stoppers 85 an 86 are located in the uppermost positions thereof. The foremost pallet 5 being conveyed on the belts 87 is stopped by the stoppers 85 so that the pallet slips on the belts. The second foremost pallet is stopped by the foremost one. The stopper 84 is then moved up so that a positioning pin 84a is fitted into the pin hole 51b of the second foremost pallet to hold it in position as the stopper reaches the uppermost position thereof. The stoppers 85 are thereafter moved down below the tops of conveyance belts 87 so that the foremost pallet 5 is conveyed by the belts again and then stopped by the other stopper 86. The positioning plate 83 is thereafter moved up so that positioning pins 81 thereon are fitted into the pin holes 51b of the foremost pallet 5 to position it above the tops of the conveyance belts 87, as shown in the part (b) of FIG. 4.

The pallet 5 is conveyed by the conveyance belts of the other conveyors 6 and 7 upstream and downstream of the workpiece automatic claiming section 2 as the optically operating members and the lead frame remain kept in the positional relationship on the pallet.

Pin holes 32c, into which positioning pins 82 are fitted, are opened in the suction surface 32 of the sucking section 3, as shown in the part (a) of FIG. 4. When the optically operating members and the lead frame are sucked up from the pallet 5 onto the suction head 3A of the sucking section, the positioning pins 82 planted in the positioning plate 83 provided on the conveyor 8 are fitted into the pin holes 32c of the sucking section to accurately position the pallet and the section relative to each other. The positions, sizes and forms of the rectangular recess 33a and semicircular-cross-section recesses 33b of the sucking section 3 correspond to those of the rectangular recess 53a and V-shaped-cross-section recesses 53b of the pallet 5 so that the members and the frame are sucked up from the pallet onto the sucking section without altering the positional relationship among the frame and the members.

The sucking section 3 also includes pins 36 secured at one end of each of them in the section head 3A and movably fitted at the other ends of the pins in the support plate 3B, and compressed helical springs 37 wound on the intermediate portions of the pins between the head and the plate to urge them in such directions as to move the head and the plate away from each other. For that reason, the suction head 3A can be pushed onto the optically operating members and the lead frame to suck them up from the pallet 5 onto the head. The head 3A can thus be put in tight contact with the members and the frame to make it surer that they are successfully sucked onto the head.

The support plate 3B has guide holes 38 larger in diameter than the pins 36 and having first engagement portions 38a located opposite the suction head 3A and divergent outward. The pins 36 have second engagement portions 36a extending in the first engagement portions 38a and located in tight contact with the support plate 3B. Since the guide holes 38 are lager in diameter than the pins 36, the pins can move in the guide holes to enable the sucking section 3 to successfully suck the optically operating members and the lead frame up from the pallet 5 onto the suction head 3A even if there is a slight positional discrepancy between the sucking section and the pallet. Since the second engagement portions 36a are located in tight contact with the support plate 3B at the first engagement portions 38a, the suction head 3A is roughly positioned relative to the support plate.

The molding section 4 includes the upper and the lower conventional dies 4A and 4B having semicircular-cross-section cavities 42 an 41, fin which the optically operating members are positioned, and cavities 44 and 43, in which the islands of the lead frame are put, as shown in the part (c) of FIG. 6. A resin is injected into the cavities 44 and 43 so that the members and the frame are integrally molded with the resin. Positioning pins 45 are planted in the lower die 4B and located to be fitted into the pin holes 32c of the suction head 3A. The positions and dimensions of the pin holes 32c are determined depending on those of the positioning pins 45 at the maximum temperature of 150° C. to 200° C. of the lower die in use so that when the members and the frame are set in the die, the pins are fitted in the pin holes to accurately position the sucking section 3 and the die relative to each other. Since the compressed helical springs 37 are provided in the sucking section, the impact of the section on the lower die 4B is reduced to lower the possibility of damaging of the die.

The outer circumferential surfaces of the optically operating members have circumferential grooves G, in which the projections P of the lower die 4B are fitted to position the members in the die, as shown in the part (c) if FIG. 6, to stabilize the positions of the members in the die to prevent the members from being displaced due to the pressure of the injected resin.

It will be understood from the above description that in the embodiment, an error in the horizontality of the pallet 5, the sucking section 3 and the molding section 4 and an error in the accuracy of their positions at the time of the setting and removal of the optically operating members and the lead frame onto and from the pallet and the sections are coped with well enough to enable the connection of the wires and the setting of the members and the frame in the dies 4A and 4B as the member and the frame remain kept in the positional relationship. For that reason, the reliability and yield of the optical module are enhanced, and the connection of the wires and the setting of the members and the frame in the dies can be performed in an unmanned manner. Although the positional relationship among the members and the frame at the time of the setting of them in the dies changes only by such a slight quantity of about 100 to 200 μm as not to stress the wires, the relationship at the time of the completion of the manufacturing the optical module is the same as that at the time of the setting of the members and the frame on the pallet 5 at the setting section 1.

Since the members and the frame are conveyed as they remain kept in the positional relationship, the wires connected to the members not secured relative to each other is less loaded. For that reason, the wires can be aluminum wires smaller in diameter than those used in the conventional method, or be gold wires of less than 100 μm in diameter, to reduce the cost of the wires or enhance the reliability thereof.

The present invention is not confined to the embodiment, but may be embodied or practiced on other carious ways without departing from the spirit or essential character of the invention. For example, although the juts of the pallet carrying surfaces of each of the conveyors 6, 7, 8 and 9 are fitted in the hollows of the bottom of the pallet 5 to position the conveyor and the pallet relative to each other, the surfaces and the bottom may have such hollows and juts, respectively, for the positioning. Although the juts of the conveyor 8 near the pallet carrying surfaces thereof are fitted in the hollows of the suction surface of the sucking section 3 to position it relative to the conveyor, the pallet carrying surfaces and the suction surface may have such hollows and juts, respectively, for the positioning. The suction head reception surface of the lower die 4B may have hollows instead of the pins 45 if the suction surface of the sucking section 3 has the juts.

There are two procedures 1 and 2, in each of which each optically operating member is positioned in the lower die 4B by fitting the projection P of the die in the circumferential groove G of the member through the use of the suction head 3A. In the procedure 1, a gas is blown onto the rear of the member to push it onto the wall surface of the die to position the member therein. In the other procedure 2, the member is put in front of a normal set position, and the wire is then connected to the member and the electronic circuit on the lead frame so that the end of the wire, which is connected to the member, is put in front of a normal position to cause the wire to have a resilient force on the member at the time of the putting of the member and the frame in their normal set positions, to push the member onto the wall surface of the lower die 4B to position the member relative thereto. The procedure 2 is described in detail with reference to FIG. 6 from now on. The wire W is connected to the member and the electronic circuit E on the frame as the distance between the member and the circuit is larger than that at the time of the positioning of the member in the lower die 4B. The former distance is (L+δ), and the latter is L, as shown in FIG. 6. When the member and the frame are sucked up from the pallet 5 onto the sucking section 3, the member is put at a slight length α from behind the normal set position, as shown in the part (a) of FIG. 6. At that time, since the sucking section 3 has a chamfer t at the end of the semicircular-cross-section recess 33b thereof, the member can be sucked onto the section only through the pushing of the suction head 3A onto the member so that the member is put behind the normal set position. When the member and the frame are thereafter set in the die, the member is put back in the normal set position, as shown in the part (c) of FIG. 6. At that time, the distance between the member and the circuit on the frame is decreased from (L+δ) to L so that the wire W is caused to have the resilient force on the member in such a direction as to increase the distance to push the front end of the member onto the wall surfaces of the upper and the lower dies 4A and 4B to keep the member in the normal set position, as shown the part (c) of FIG. 6.

According to the present invention, optically operating members and a lead frame for an optical module are conveyed to a wire connection means and dies as the members and the frame remain kept in a positional relationship. During the period of the conveyance, connecting wires to the members and the fame, and setting them in the dies are automatically performed. Since the members and the frame are kept in the positional relationship, the wires are prevented from being broken or cut off. Therefore, the reliability and yield of the module are enhanced.

In an optical module manufacturing apparatus provided in accordance with the present invention, optically operating members and a lead frame for an optical module are conveyed to a wire connection means and dies as the members and the frame remain kept in a positional relationship. During the period of the conveyance, connecting wires to the members and the frame, and setting them in the dies are automatically performed. For that reason, the apparatus is capable of unmanned operation, high in productivity, and applicable to a single-unit-flow production line.

Embodiments of a second aspect of the present invention are hereafter described with reference to the drawings attached hereto. Hereinafter, mutually equivalent parts are denoted by identical reference symbols, and not repeatedly described.

Figure 9:
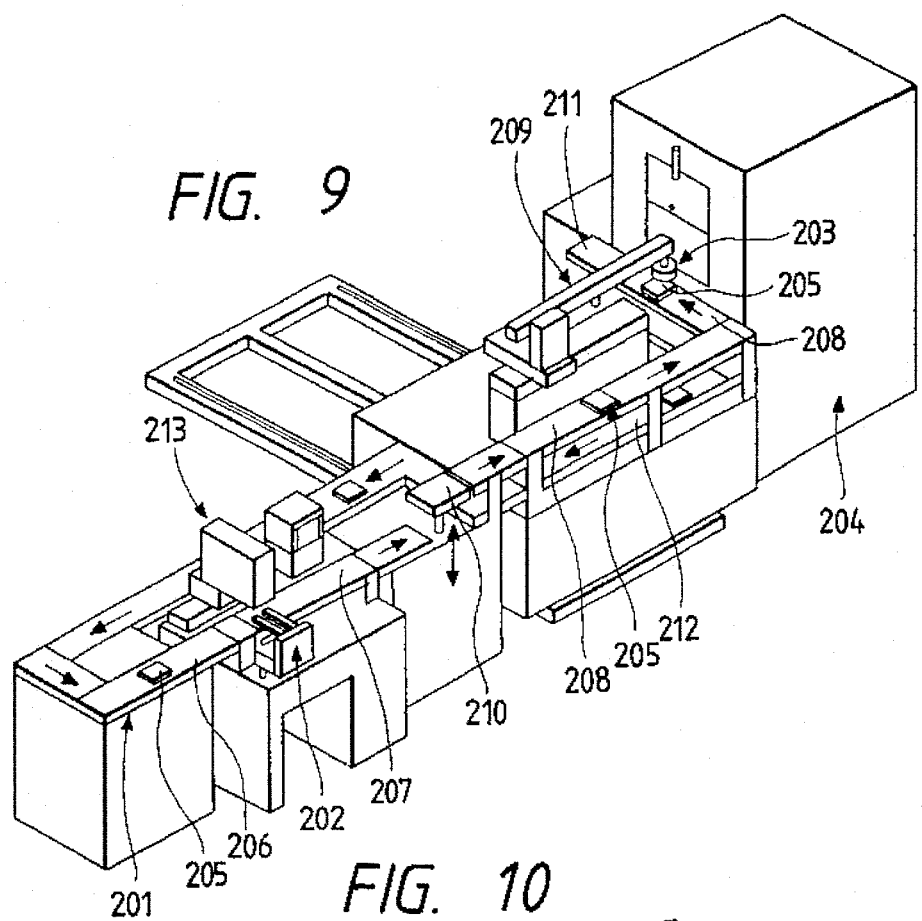
FIG. 9 is a perspective view of an optical module manufacturing apparatus including the clamper as a pallet.

FIG. 8 is a perspective view of a clamper 205 which is one of the embodiments. FIG. 9 is a perspective view of an optical module manufacturing apparatus including the clamper 205 as a conveyance pallet. The clamper 205 includes positioning grooves 251, a clamping surface 252, holding members 253, swing mechanisms 254, and a clamping member 255.

The positioning grooves 251 have semicircular cross sections. The pins of optically operating members which are a light emitter E/O and a light receiver O/E, for example, are positioned by the grooves 251. The clamping surface 252 is a plane surface on which a lead frame L/F is put. Each of the holding members 253 has a semicircular-cross-section groove 253 in which the pin of the corresponding optically operating member is fitted. The members E/O and O/E are pushed in the positioning grooves 251 with the holding members 253 and screws 257 tightened thereon. Each of the swing mechanisms 254 includes a secured pin 254a fitted in the central part of a clamper portion having the positioning groove 251, a compressed helical spring 254b engaged with the bottom of the portion and urging it downward, and a pivotal pin 254c fitted in the end part of the portion opposite the groove and coupling the portion to the corresponding holding member 253. The spring 254b urges the clamper portion downward opposite the positioning groove 251 across the secured pin so that the groove and the holding member 253 can be swung together clockwise as to FIG. 8.

The positioning grooves 251 and the clamping surface 252 are provided so that the lead pins 103 of the optically operating members E/O and O/E positioned in the grooves are located slightly higher than the surface. For that reason, the tips of the pins are always put in contact with the surface when the members E/O and O/E are pushed in the grooves 251 with the holding members 253 and the screws 257 tightened thereon. The peripheral portion of the lead frame L/F is pushed on the clamping surface 252 with the clamping member 255 and screws 256 tightened thereon to secure the member. The clamping member 255 has an opening at which the wire-connected portions of the lead frame L/F are exposed to make it possible to connect wires to the portions by the wire bonding section of the apparatus without hindrance.

The optical module manufacturing apparatus, which conveys the clamper 205 as a pallet, includes a setting section 201, a workpiece automatic clamping section 202, the wire bonding section 213, a sucking section 203, a molding section 204, and conveyors 206, 207, 208 and 209 for conveying the clamper to the sections. After the clamper 205 is conveyed to the workpiece automatic clamping section 202 by the conveyor 206, the wires are connected to the optically operating members E/O and O/E and the lead frame L/F by the wire bonding section 213 as the members and the frame remain kept in a positional relationship on the clamper. A workpiece having the members, the frame and wires thus connected to them is set in dies. Positioning tapered pins are planted in the clamper carrying surfaces of the conveyors 206, 207 and 208 so that the pins extent perpendicularly to the surfaces. The clamper 205 has pin holes in positions corresponding to those of the positioning pins so that the pins be fitted in the holes to position the clamper on each conveyor relative thereto. For that reason, the optically operating members and the frame can be conveyed by the conveyors 206, 207, 208 and 209 as the members and the frame remain kept in the positional relationship. As a result, the wires can be connected to the members and the frame by the wire bonding section 213 as the members and the frame kept in the positional relationship on the clamper 205, and the members and the frame can be set in the dies as the members and the frame remain kept in the relationship.

After the clamper 205 is conveyed to the setting section 201 by the conveyor 206, the clamper is fixed in a prescribed position, and the optically operating members E/O and O/E and the lead frame L/F are positioned on the clamper so as to be kept in the positional relationship. At that time, optically operating elements are already included in the members, and a plurality of electronic circuit elements constituting electronic circuits which are a sending and a reception circuits to be connected to the members, are already mounted on the islands of the lead frame. At the setting section 201, the wires are not yet connected to the optically operating members and the lead frame. After the positioning, the clamper 205 is conveyed from the setting section 201 to the workpiece automatic clamping section 202 by the conveyor 206. At the clamping section 202, the wires are connected to the optically operating members and the lead frame by the wire bonding section 213 as the members and the frame remain kept in the positional relationship on the clamper 205. At that time, the inner lead pins of the lead frame and the electronic circuits formed on the islands of the frame are connected to each other with some of the wires, and the circuits and the members are connected to each other with the others of the wires. The clamper 205 is thereafter conveyed to the sucking section 203 by the conveyors 207 and 208. Since the conveyor 208 is located above the other conveyor 207, the clamper 205 conveyed by the latter is moved up to the former by a lifter 210. At the sucking section 203, the holding members 253 of the clamper 205 are moved up, and the clamping member 255 thereof is removed, so that the workpiece can be sucked up from the clamper onto the section. As a result, the workpiece can be set in the dies through the use of the sucking section 203. After the setting, the clamper 205 is moved down onto a retrieving conveyor 212 by a lifter 211, and then conveyed back to the setting section 201 by the conveyor.

Although the clamper 205 has both a clamper function and a pallet function, a pallet may be provided separately from the clamper, and conveyed. If the pallet is thus used, the wires are connected to the optically operating members and the lead frame on the clamper, the workpiece is thereafter picked up from the clamper with tweezers or the like and put on the pallet, and the workpiece is then conveyed on the pallet to the sucking section 203 by the conveyors 207 and 208.

Figure 10:
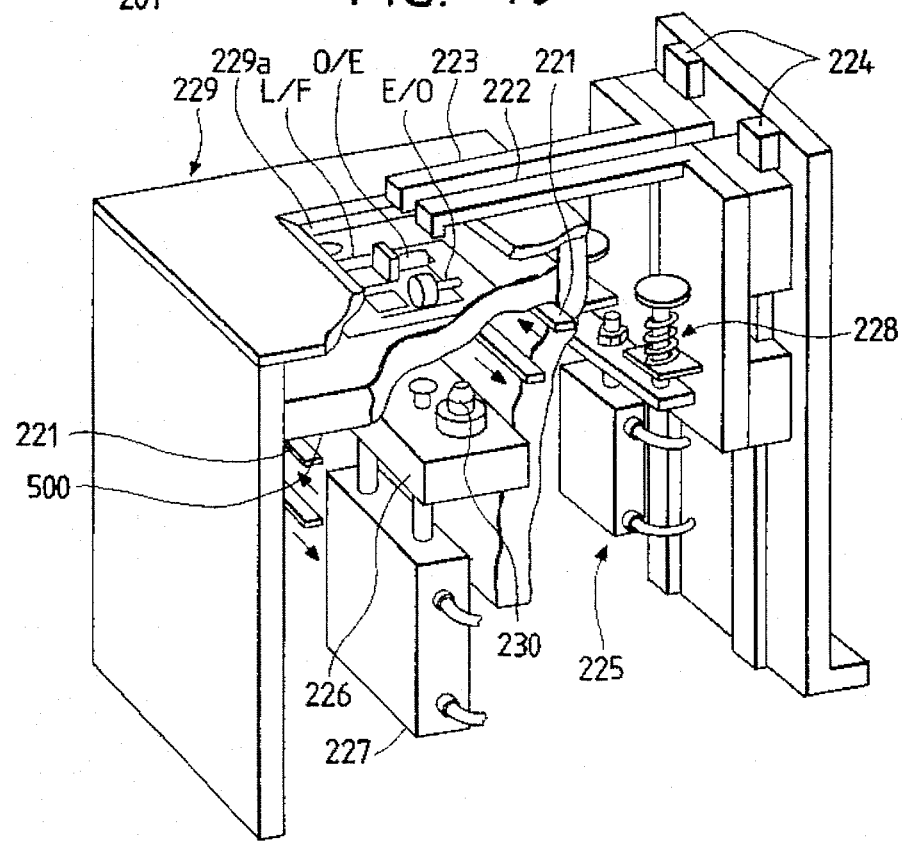
FIG. 10 is a perspective view of a clamper which is another embodiment of the invention.
Figure 11:
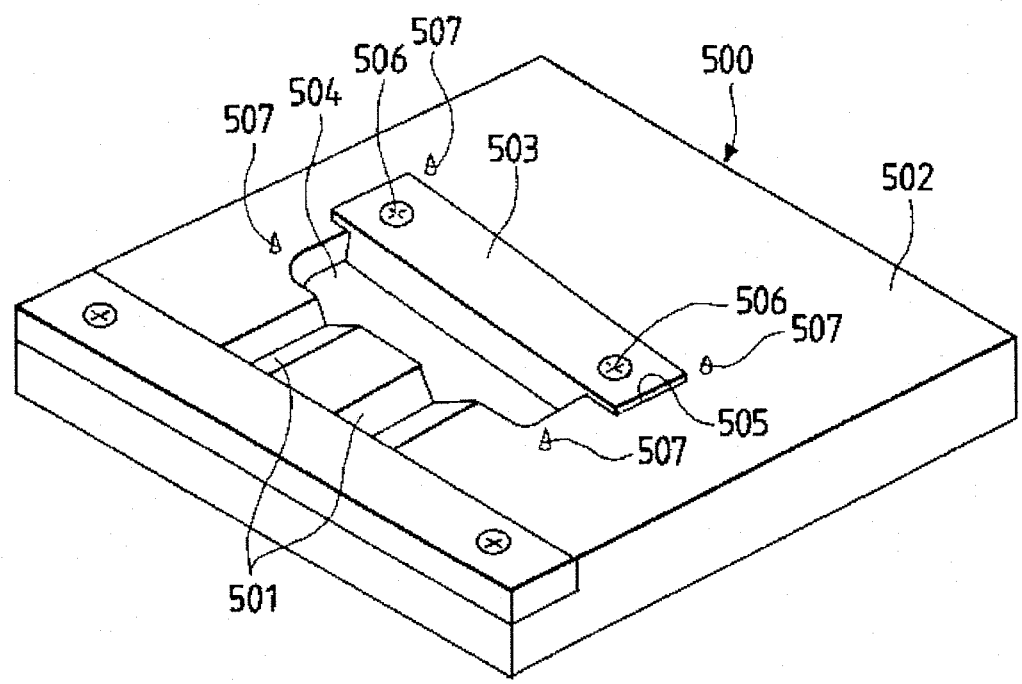
FIG. 11 is a perspective view of a pallet included in the clamper shown in FIG. 10.

FIGS. 10 and 11 show a clamper which is the other of the embodiments. The difference of the clamper from that shown in FIG. 8 is that a pallet is provided separately from the main part of the clamper. FIG. 10 is a perspective view of a major part of a workpiece automatic clamping section including the clamper. FIG. 11 is a perspective view of the pallet 500 included in the clamper.

The pallet 500 includes a pair of positioning grooves 501, a clamping surface 502, and a processing portion 503. The clamping surface 502 has an oblong flat part of such size that at least the peripheral portion of a lead frame L/F can be put on the part. Inside the part, the positioning grooves 501 and the processing portion 503 are located. The grooves 501 have V-shaped cross sections. The pallet 500 also includes a first rectangular opening 504 between the processing portion 503 and the positioning grooves 501, and a second rectangular opening 505 communicating with the first one. The processing portion 503 is removably secured over the second opening 505 by screws 506. The pallet 500 has four positioning pins 507 planted around the first and the second openings 504 and 505 so that the pins be fitted in the positioning holes of the lead frame L/F. Since the processing portion 503, on which the wire-connected portions of a workpiece having the lead frame and optically operating members is put, is constituted by a separate member secured to the body of the pallet 500 by the screws 506 and projects from the clamping surface 502, the cover 229 of the clamper, under which the wire-connected portions of the workpiece are placed, can be put in tight contact with the processing portion nearer the wire-connected portions so as to reduce the loss of ultrasonic waves to enhance the yield of the ultrasonic connection of wires to the wire-connected portions. If the processing portion 503, which is likely to be damaged in a relatively short period because of the wire-connected portions are put on the processing portion and a wire bonding section pushes it, is reduced in size and simplified in form, the cost of the processing portion to be replaced is lowered.

The main part of the clamper includes a light emitter clamping member 222, a light receiver clamping member 223, linear guides 224, a cylinder unit 225, a support member 226, a cylinder unit 227, compressed helical springs 228, and the cover 229. The conveyance belts 221 of a conveyor convey the pallet 500 together with the lead frame L/F and the optically operating members E/O and O/E to the workpiece automatic clamping section including the clamper. At the clamping section, the lead frame and the optically operating members for an optical module are clamped by the clamper as the frame and the members remain kept in a positional relationship on the pallet 500. The wires W are then connected to the frame and the members.

The cylinder unit 225 moves the clamping members 222 and 223 up and down along the linear guides 224. The quantities of the vertical movement of the clamping members 222 and 223 can be regulated by controlling the operation of the cylinder unit 225. The compressed helical springs 228 are coupled to the cylinder unit 225 so that the forces of the clamper, which push the pins of the optically operating members E/O and O/E, can be modulated by altering the stiffness of the springs or the quantity of the downward movement of the piston rod of the cylinder unit.

The support member 226 provided with positioning pins 230, which are fitted in the pin holes of the pallet 500, is disposed under the conveyance passage for the pallet so that the support member can be moved up and down by the other cylinder unit 227. The support member 226 is moved up by the cylinder unit 227 in order to push the pallet 500 onto the cover 229 to clamp the workpiece in between the pallet and the cover. The cover 229 has an opening 229a at which the wire-connected portions of the workpiece are exposed. The tip portions of the clamping members 222 and 223 are located over the opening 229a, and each shaped as L to push the optically operating members E/O and O/E between the pin support processing portion 503 and front end support portions of the pallet 500 to hold the pins of the optically operating members down on the processing portion.

When the wires W are to be connected to the optically operating members and the lead frame, the cylinder unit 227 is first driven to move up the support portion 226 so that the lead frame is pushed onto the cover 229 disposed over the support member, and the positioning pins 230 provided on the support member are fitted into the pin holes of the pallet 500 to position and clamp it. The other cylinder unit 225 is then driven to move down the clamping members 222 and 223 to clamp the optically operating members E/O and O/E on the pallet 500. The wires W are then connected to the lead frame and the optically operating members.

Figure 12:
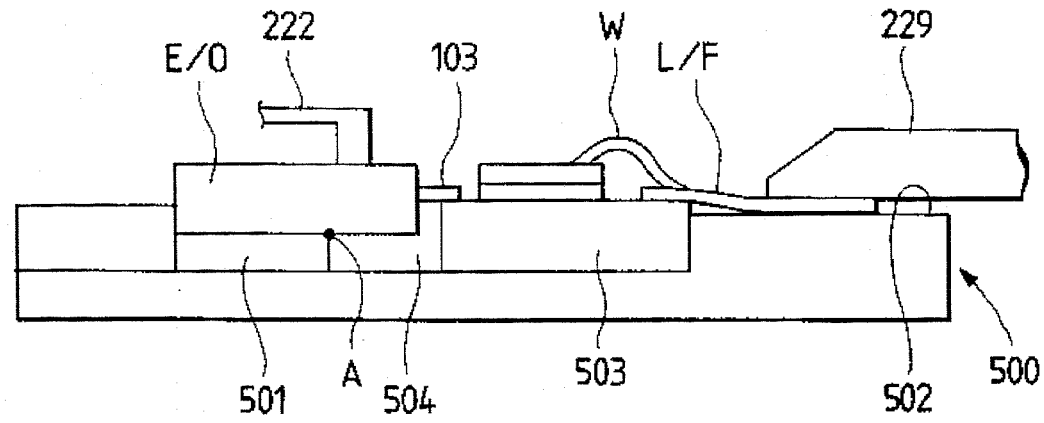
FIG. 12 is a sectional view to illustrate the state that a lead frame and optically operating members are clamped by the clamper shown in FIG. 10.
Figure 13:
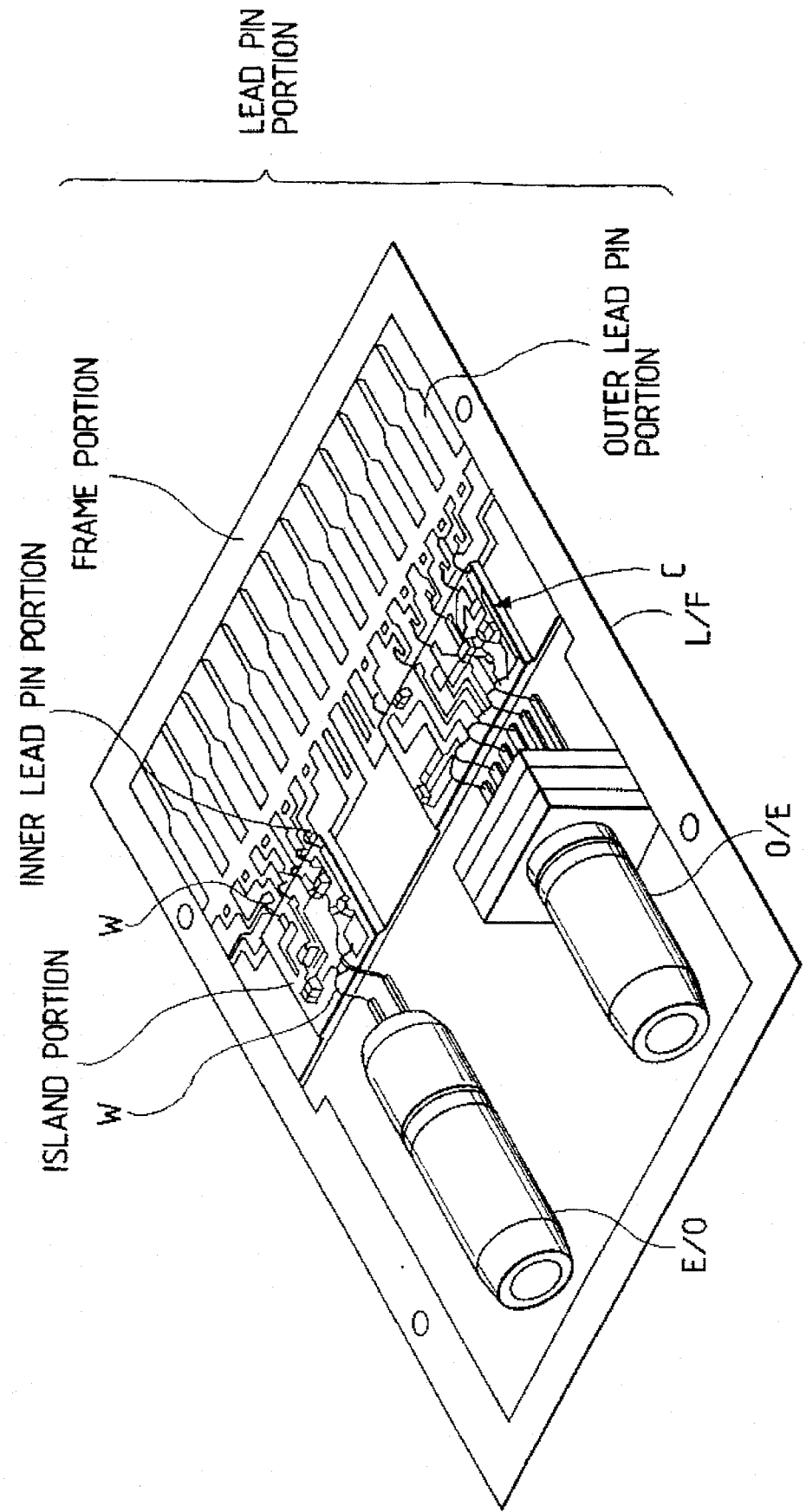
FIG. 13 is a perspective view of a workpiece having optically operating members and a lead frame connected thereto.
Figure 14:
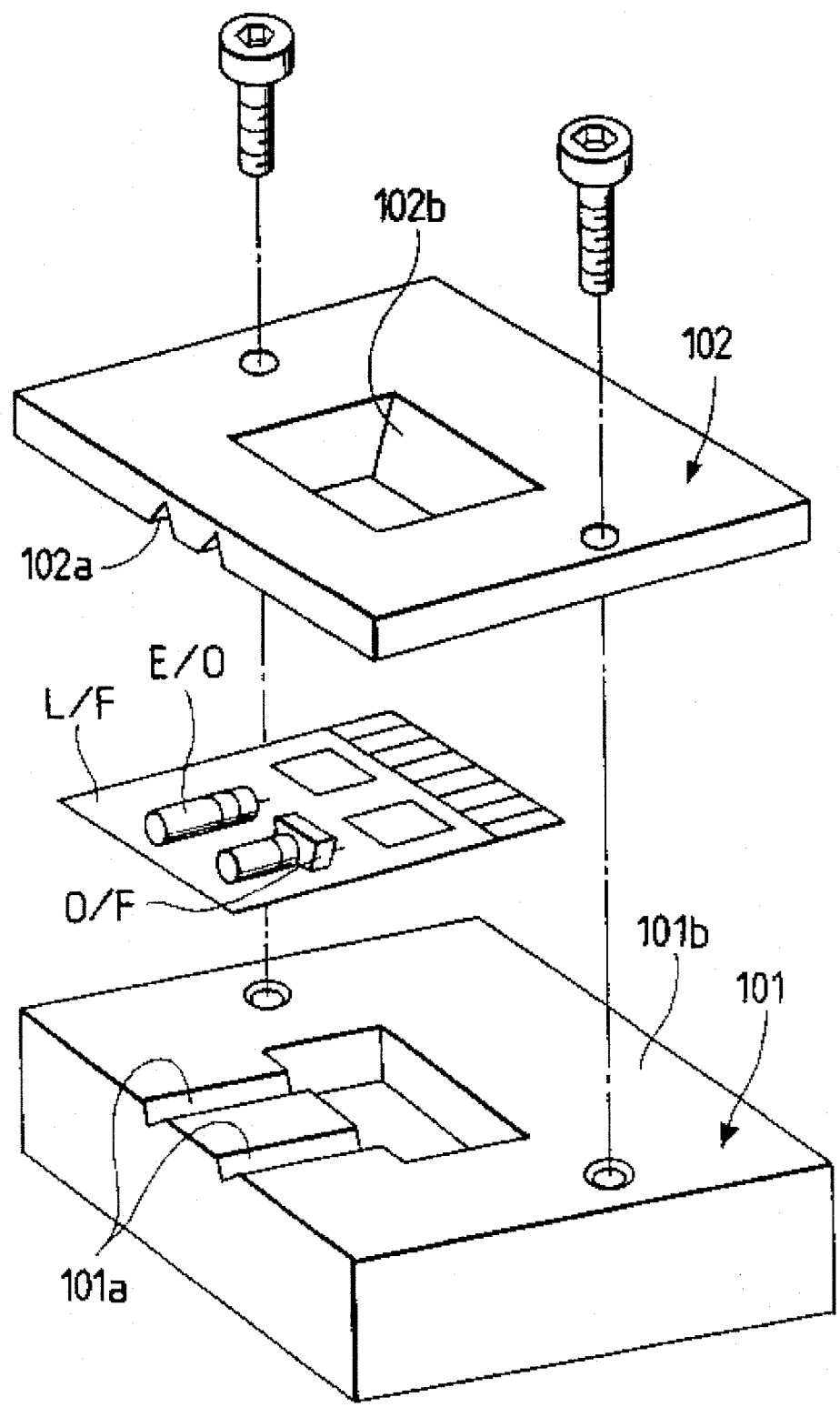
FIG. 14 is an exploded perspective view of a conventional clamper for connection of wires.
Figure 15A:
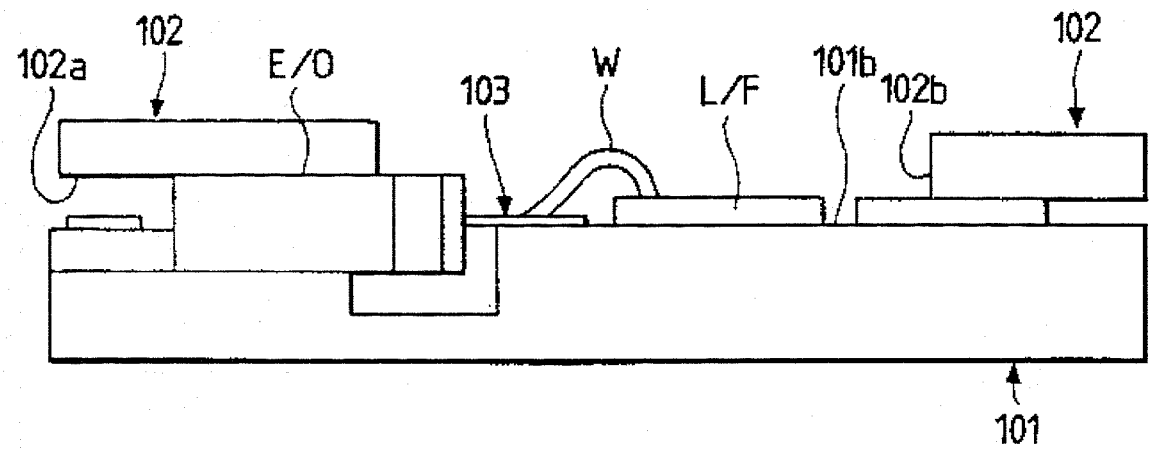
FIGS. 15(A)–(C) are views to describe the problems of the conventional clamper.
Figure 15B:
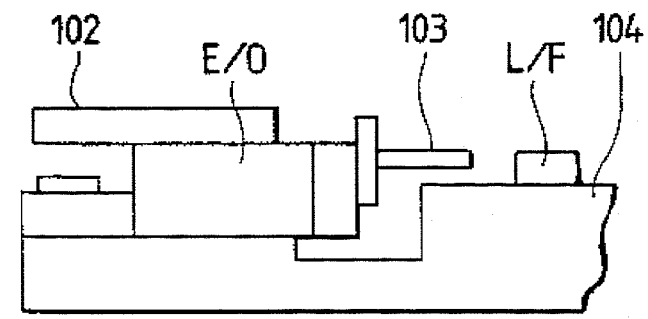
Figure 15C:
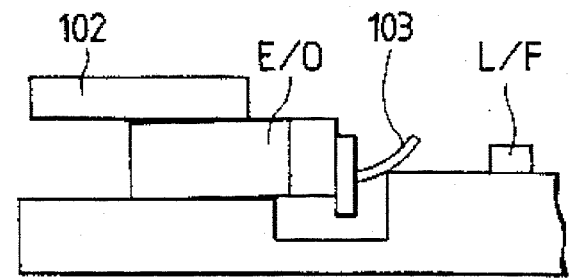

FIG. 12 is a sectional view to illustrate the state and the lead frame L/F and the optically operating members E/O and O/E are clamped on the pallet 500 by the clamper. What is important about the clamping is that the light emitter clamping member 222 pushes the ping of the light emitter E/O located in the first opening 504 of the pallet 500. For that reason, clockwise moment acts to the light emitter E/O about a fulcrum A with regard to FIG. 12 so that the end of the lead pin of the emitter is pushed on the processing portion 503. In other words, the end of the lead pin is put in tight contact with the processing portion 503. The same thing takes place to the light receiver O/E.

Since the workpiece is not fastened to the clamper but simply clamped by it through the use of the pallet 500 carrying the workpiece, the setting and removal of the workpiece and the connection of the wires W can be performed at mutually different places so as to much shorten a cycle time of continuous manufacturing of the optical modules.

As for each of the embodiments, the workpiece does not need to be taken out alone from the optical module manufacturing apparatus. For that reason, the wires W are not damaged due to the weight of the optically operating members. Therefore, the wires W are less likely to be broken or cut off, and are allowed to be smaller in diameter than the aluminum wires used in the conventional art or be gold wires of less than 100 μ in diameter, to lower the cost of the module or enhance the reliability thereof.

The present invention is not confined to the embodiments described above, but may be embodied or practiced in other various ways without departing from the spirit or essential character of the invention. For example, the positioning grooves 251 and 501 may not be V-shaped-cross-section grooves, and not be semicircular-cross-section grooves.

According to the present invention, the wire-connected portions of a workpiece for an optical module are put in tight contact with a clamping surface so as to avoid lowering the strength of wires and enhance the yield of the manufacturing of the module. If a clamp is provided to be used as a pallet in a conveyance line, the wires can be automatically connected to optically operating members and a lead frame, and are prevented from being broken or cut off during the conveyance of the workpiece.

What is claimed is:

1. A method for manufacturing an optical module, the optical module having optical members with respective lead pins and a lead frame having inner leads, the lead frame also having circuitry provided thereon, comprising the steps of:

positioning said optical members and said lead frame on a pallet with a fixed positional relationship between said optical members and said lead frame;

connecting said circuitry provided on said lead frame to said respective lead pins of said optical members and also to said inner leads of said lead frame, to thereby form an assembly; and conveying said optical members and said lead frame from said pallet to a die by suctioning said assembly of said optical members and said lead frame from said pallet and placing said assembly on said die, while maintaining said fixed positional relationship between said optical members and said lead frame, thereby obtaining the optical module.

2. A method according to claim 1, wherein said step of positioning said optical members and said lead frame on said pallet includes a step of positioning each optical member in a respective recess provided on said pallet and positioning said lead frame on a lead frame carrying surface of said pallet.

3. A method according to claim 1, wherein said step of suctioning said optical members and said lead frame comprises using a suction device having a movable suction head, wherein said suction head is provided with recesses for receiving said optical members and said lead frame, respectively, so as to maintain said fixed positional relationship between said optical members and said lead frame.

4. A method according to claim 3, wherein said suction head and at least one of said pallet and said die have respective engageable guides for orienting said suction head relative to said at least one of said pallet and said die.

5. A method according to claim 1, further including, after said step of conveying said optical members and said lead frame to said die, a step of correcting respective positions of said optical members and said lead frame.

6. A method according to claim 5, wherein said optical members are cylindrical and have circumferential grooves formed therein, wherein said die is provided with projections which are receivable in said circumferential grooves, wherein said position correcting step comprises adjusting the relative positions of said optical members and said die so that said protections are fitted in said circumferential grooves.

7. A method according to claim 5, wherein said suction head has at least one hole provided therein for blowing a gas therefrom, wherein said position correcting step comprises blowing a gas onto said die on which said optical members are disposed to thereby move said optical members into desired respective positions.

8. A method according to claim 1 further comprising the step of:
clamping said optical members and said lead frame with a clamp while connecting wires to said optical members and said lead frame.

9. A method according to claim 8, wherein said step of clamping comprises a step of using a clamp, said clamp comprising:
a clamping base;
a clamping member opposing said clamping surface;
positioning members having grooves for positioning said optical members relative to said clamping surface;
holding members for holding said optical members in said positioning grooves; and
swing mechanisms for swinging said holding members and said positioning grooves together,
wherein said clamping step comprises swinging said holding members toward said positioning members to thereby clamp said optical members between said holding members and said positioning members.

10. A method according to claim 9, each said lead pin having a respective end, and wherein said clamping step includes using said swing mechanisms to push said ends of said lead pins onto said clamping surface with a substantially constant force.

11. A method according to claim 8, wherein said clamp comprises:
a clamping surface formed on said pallet;
positioning members having grooves for positioning said optical members relative to said clamping surface;
a processing portion which extends from said clamping surface and on which said lead frame and ends of said lead pins of said optical members are disposed; and
holding members for holding said optical members positioned in said grooves of said positioning members,
wherein said clamping step comprises clamping said optical members between said holding members and said positioning grooves.

12. A method according to claim 11, wherein said clamping step comprises a step of using said holding members to hold said ends of said lead pins of said optical members onto said processing portion with a substantially constant force.

* * * * *